United States Patent
Lee

(10) Patent No.: US 7,858,515 B2
(45) Date of Patent: Dec. 28, 2010

(54) METHOD FOR FORMING METAL LINE IN SEMICONDUCTOR DEVICE

(75) Inventor: Han-Choon Lee, Songpa-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/247,517

(22) Filed: Oct. 8, 2008

(65) Prior Publication Data
US 2009/0104768 A1    Apr. 23, 2009

(30) Foreign Application Priority Data
Oct. 18, 2007    (KR) .................... 10-2007-0105078

(51) Int. Cl.
*H01L 21/4763* (2006.01)
(52) U.S. Cl. .................. 438/636; 438/637; 438/683
(58) Field of Classification Search .............. None
See application file for complete search history.

(56) References Cited

U.S. PATENT DOCUMENTS 6,133,145 A * 10/2000 Chen .......................... 438/636
6,169,029 B1 * 1/2001 Yang .......................... 438/671
6,599,829 B2 * 7/2003 Smith et al. .................. 438/636
6,958,294 B2 * 10/2005 Smith et al. .................. 438/683
7,001,843 B2 * 2/2006 Park .......................... 438/669
7,001,848 B1 * 2/2006 Smith et al. .................. 438/725
7,279,415 B2 * 10/2007 Frohberg et al. ............. 438/637

FOREIGN PATENT DOCUMENTS

KR    10-2005-0015116    2/2005
KR    10-2006-0072217    6/2006

* cited by examiner

*Primary Examiner*—Zandra Smith
*Assistant Examiner*—Khanh B Duong
(74) *Attorney, Agent, or Firm*—Sherr & Vaughn, PLLC

(57) ABSTRACT

A method for forming a metal line in a semiconductor device may include forming a silicon (Si) monolayer as an etching prevention layer over an exposed portion of a lower metal layer and sidewalls of an upper metal layer, middle metal layer, and the entire surface of curved photoresist patterns.

20 Claims, 4 Drawing Sheets

METHOD FOR FORMING METAL LINE IN SEMICONDUCTOR DEVICE

The present application claims priority under 35 U.S.C. §119 to Korean Patent Application No. 10-2007-0105078 (filed on Oct. 18, 2007), which is hereby incorporated by reference in its entirety.

BACKGROUND

Figure 1:
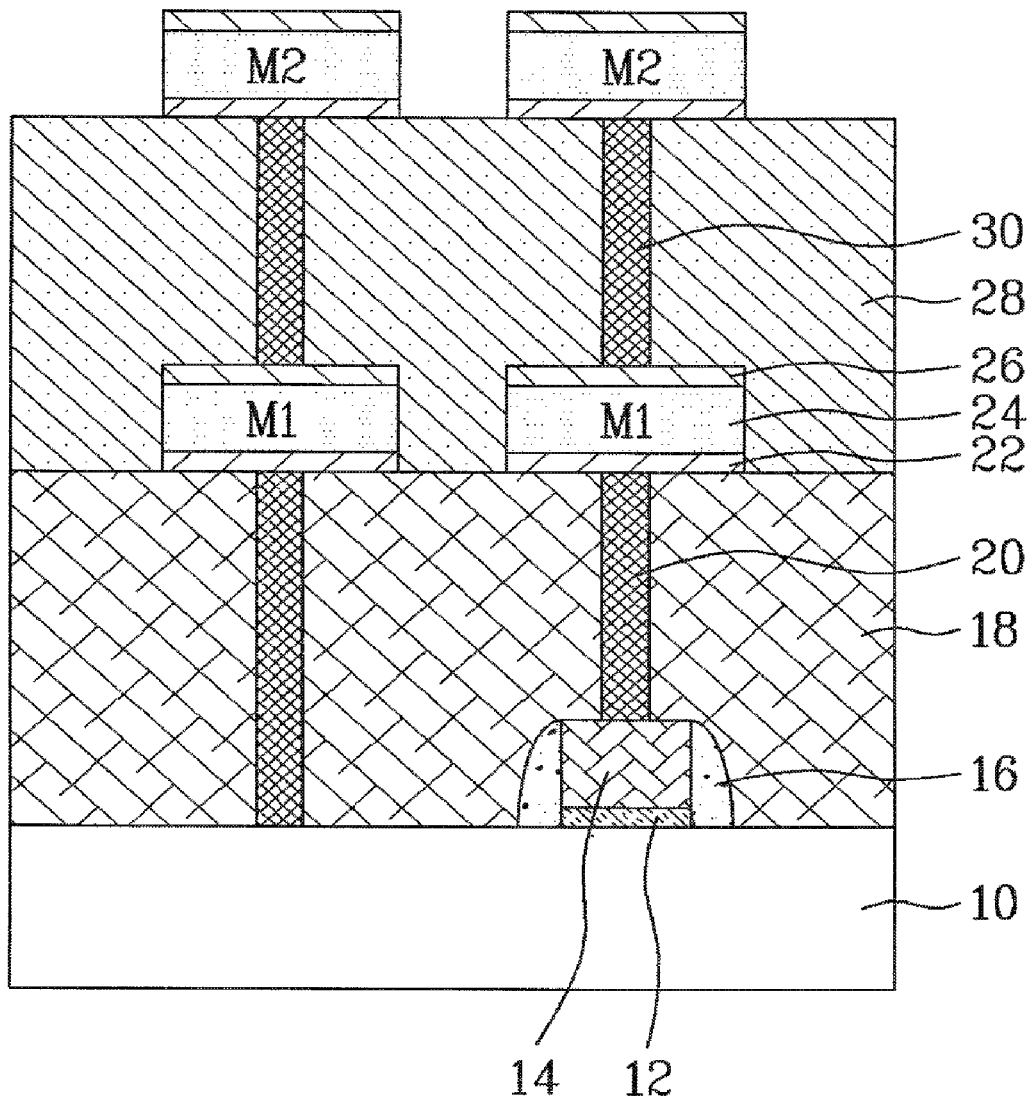

As illustrated in example FIG. 1, a semiconductor metal line may include gate dielectric layer 12 and poly gate 14 formed on and/or over semiconductor substrate 10, and spacer 16 formed on sidewalls of gate dielectric layer 12 and poly gate 14. First interlayer dielectric 18 is formed on and/or over the entire surface of substrate 10 including poly gate 14 and spacer 16. Lower contact plug 20, composed of a metal such as tungsten (W), is formed in first interlayer dielectric 18 to connect source/drains and gates to lower metal line M1 formed on and/or over first interlayer dielectric 18. Lower metal line M1 may include lower layer 22, aluminum (Al) metal layer 24 and upper layer 26. Upper contact plug 30, upper metal line M2 and second interlayer dielectric 28 are structured in a similar manner to lower contact plug 20, lower metal line M1 and first interlayer dielectric 18, respectively.

More specifically, in order to construct lower metal line M1 and upper metal line M2, lower layer 22, metal layer 24 and upper layer 26 are sequentially deposited on and/or over first interlayer dielectric 18 and second interlayer dielectric 28, respectively. Next, lower layer 22, metal layer 24 and upper layer 26 are partially etched such that a plurality of lower metal lines M1 and upper metal lines M2 are formed spaced apart from one another as illustrated in FIG. 1. Generally, the same etching gas is used when etching upper layer 26, metal layer 24 and lower layer 22. Since metal layer 24 is etched prior to lower layer 22, lateral sides of metal layer 24, being exposed, are attacked during etching of lower layer 22. More particularly, in a case where aluminum (Al) is used for the metal line, intervals between the metal lines are reduced as the size of the semiconductor device is reduced. Therefore, when etching lower layer 22 formed of titanium (Ti) or titanium nitride (TiN) by reactive ion etching (RIE), fluorine contained in $C_xF_y$ gas used for etching lower layer 22 may affect sidewalls of Al layer 24 which is already etched. Accordingly, the reliability of the device, especially electromigration (EM), may be deteriorated.

SUMMARY

Embodiments relate to a semiconductor device and a method for forming a metal line in a semiconductor device, such as an aluminum line of about 0.13 µm.

Embodiments relate to a method for forming a metal line in a semiconductor device that prevents damage of lateral sides of a metal layer during etching of a lower layer.

Embodiments relate to a method for forming a metal line in a semiconductor device that may include at least one of the following steps: sequentially forming a dielectric layer, a lower layer, a metal layer and an upper layer on and/or over a semiconductor substrate; and then forming a photoresist pattern partially exposing the upper layer corresponding to horizontal intervals among metal lines; and then etching the upper layer and the metal layer using the photoresist pattern as a mask, such that the lower layer is partially exposed; and then forming a metal etching prevention layer through the whole surface of the exposed lower layer, the etched upper layer, the etched metal layer and the photoresist pattern; and then etching the lower layer using the photoresist pattern including the metal etching prevention layer, such that the dielectric layer is partially exposed.

Embodiments relate to a method for forming a metal line in a semiconductor device that may include at least one of the following steps: sequentially forming a dielectric layer, a lower layer, a metal layer and an upper layer sequentially over a semiconductor substrate; and then forming a photoresist pattern partially exposing the upper layer a predetermined lateral spatial interval; and then etching the upper layer and the metal layer using the photoresist pattern as a mask to partially expose the lower layer by the predetermined lateral spatial interval; and then forming a metal etching prevention layer over the exposed lower layer, the etched upper layer, the etched metal layer and the photoresist pattern; and then etching the lower layer using the photoresist pattern and the metal etching prevention layer as masks to partially expose the dielectric layer by the predetermined lateral spatial interval.

Embodiments relate to a method that may include at least one of the following steps: sequentially forming a dielectric layer, a lower metal layer, a middle metal layer and an upper layer over a semiconductor substrate; and then exposing a portion of the upper metal layer by forming photoresist patterns spaced apart a predetermined distance on the upper metal layer; and then exposing a portion of the lower metal layer by simultaneously etching the upper metal layer, the middle metal layer using an etching gas and also partially etching the photoresist patterns; and then simultaneously forming a silicon (Si) monolayer as a etching prevention layer over the exposed portion of the lower metal layer and sidewalls of the upper metal layer, the middle metal layer, and the entire surface of the photoresist patterns and also removing a component of the etching gas; and then forming metal lines over the semiconductor substrate by etching the exposed portion of the lower metal layer to expose a portion of the dielectric layer.

DRAWINGS

Example FIG. 1 illustrates a semiconductor metal line in a semiconductor device.

Example FIG. 2A through FIG. 2F illustrate a method for forming a metal line in a semiconductor device in accordance with embodiments.

DESCRIPTION

Reference will now be made in detail to embodiments, examples of which are illustrated in the accompanying drawings. Wherever possible, the same reference numbers will be used throughout the drawings to refer to the same or like parts.

Figure 2A:
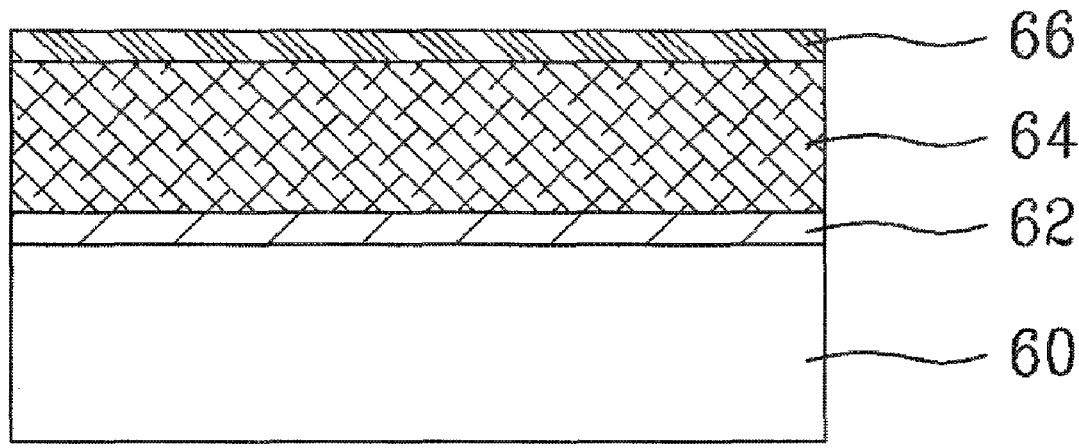

As illustrated in example FIG. 2A, a metal line in a semiconductor device may be formed by sequentially forming dielectric layer 60, lower metal layer 62, middle metal layer 64 and upper layer 66 on and/or over a semiconductor substrate. For example, lower metal layer 62 and upper metal layer 66 may be composed of one of titanium (Ti), titanium nitride (TiN) and compounds thereof. Middle metal layer 64 may be composed of aluminum (Al). Lower metal layer 62, middle metal layer 64 and upper metal layer 66 may be deposited by physical vapor deposition (PVD). In accordance with embodiments, vapor-deposition of lower metal layer 62 and upper metal layer 66 may be performed at a temperature in a range between approximately room temperature (25° C.) to 300° C. Vapor-deposition of lower metal layer 64 may be performed at a temperature in a range between approximately 25° C. to 450° C.

Figure 2B:
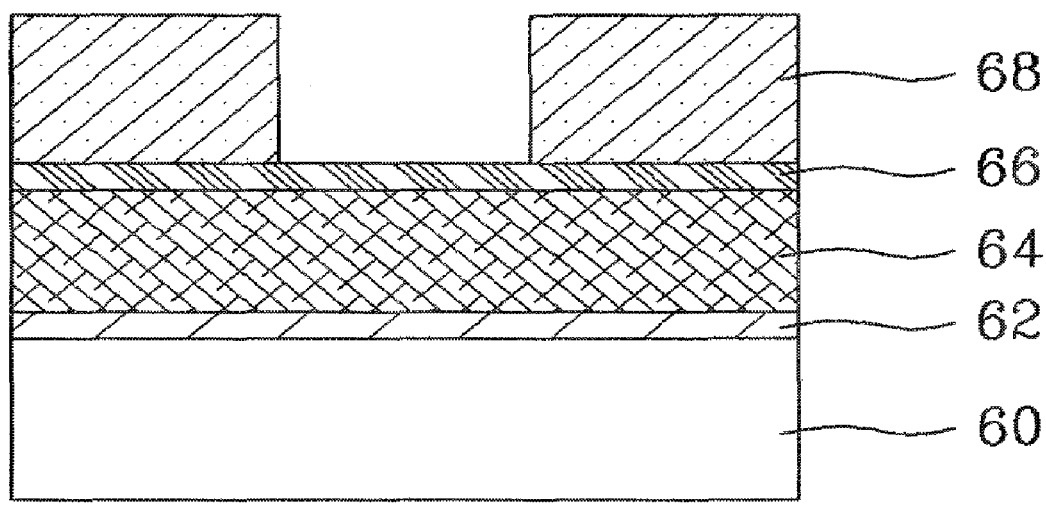

As illustrated in example FIG. 2B, photoresist pattern 68 is then formed to expose a portion of upper metal layer 66, corresponding to horizontal intervals among metal lines. Here, the horizontal interval refers to a lateral spatial distance 72 between respective metal lines M1 or M2 as illustrated in example FIG. 2F. For example, photoresist pattern 68 may be formed by applying a photoresist film on and/or over upper metal layer 66 and performing lithography with the photoresist film.

Figure 2C:
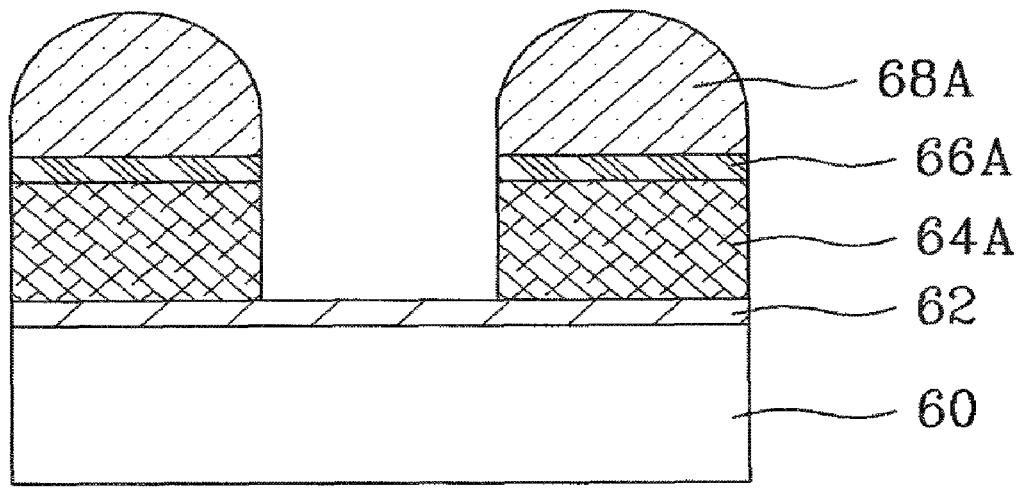

As illustrated in example FIG. 2C, upper metal layer 66 and middle metal layer 64 are then etched through reactive ion etching (RIE) using photoresist pattern 68 as a mask to expose a portion of lower metal layer 62. While upper metal layer 66 and middle metal layer 64 are being etched, photoresist pattern 68 is also partially etched. As a result, an upper portion of photoresist pattern 68 is curved. In accordance with embodiments, upper metal layer 66 and middle metal layer 64 can be etched using a $C_xF_y$ based etching gas.

Figure 2D:
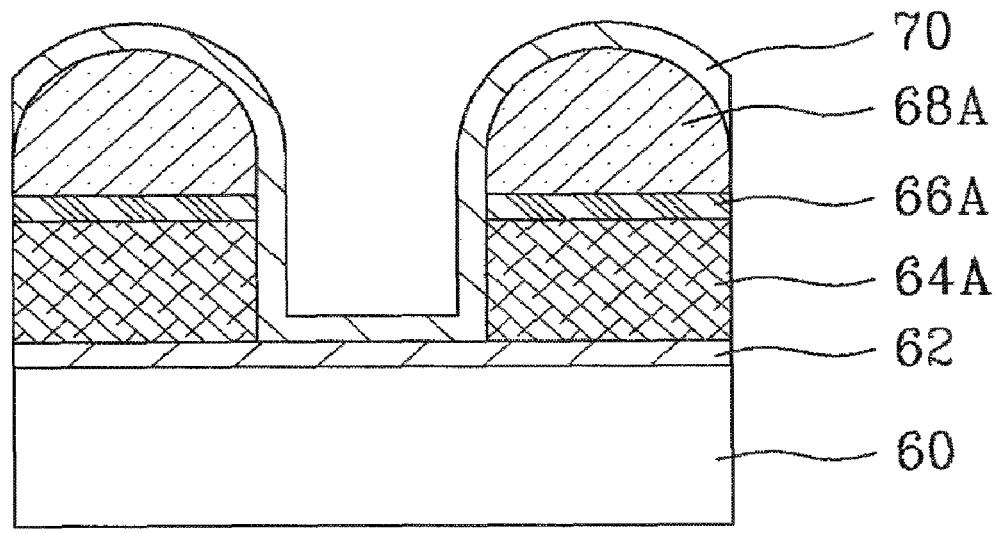

As illustrated in example FIG. 2D, silane ($SiH_4$) gas is injected on and/or over a portion of exposed lower metal layer 62, sidewalls of the etched upper metal layer 66A, sidewalls of the etched middle metal layer 64A, and the entire surface of the curved photoresist pattern 68A, thereby forming a silicon (Si) monolayer, i.e., metal etching prevention layer 70. For example, the temperature condition for the process of forming metal etching prevention layer 70 may be in a range between approximately 100 to 200° C. and the injected $SiH_4$ quantity may be in a range between approximately 100 to 2000 sccm. When injecting the $SiH_4$, hydrogen (H) reacts with the remaining fluorine while upper metal layer 66 and middle metal layer 64 are being etched, thereby generating $HF_x$ as a result of the reaction. Therefore, the fluorine generated from the etching process of upper metal layer 66 and middle metal layer 64 can be removed in the form of $HF_x$.

Figure 2E:
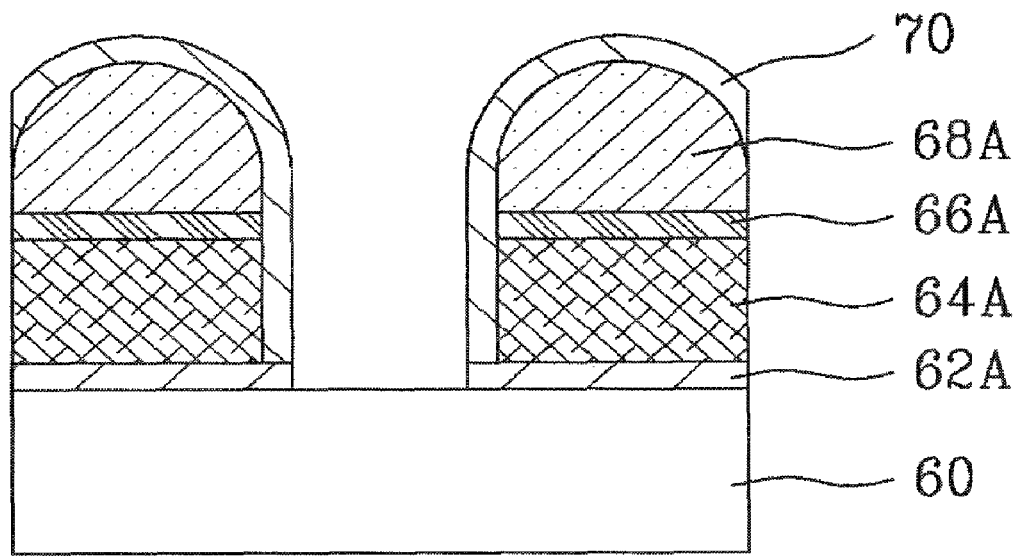

As illustrated in example FIG. 2E, the exposed portion of lower metal layer 62 and a portion of metal etching prevention layer 70 formed thereon and/or thereover is etched using photoresist pattern 68A as a mask to expose a portion of first dielectric layer 60. When partially etching lower metal etching prevention layer 70 layer 62, a bias application voltage of the $C_xF_y$ based etching gas may be set in a range between approximately 10 to 1000 W to produce a substantially straight plasma gas. However, plasma gas not having straightness may still exist and, in this case, the sidewalls of middle metal layer 64A can be protected from attack of the fluorine due to metal etching prevention layer 70. Furthermore, the fluorine, which is generated when partially etching lower metal layer 62 using the $C_xF_y$ etching gas, reacts with the Si of metal etching prevention layer 70, accordingly generating $SiF_x$ as a result. Meaning, the fluorine can be removed in the form of $SiF_x$.

Figure 2F:
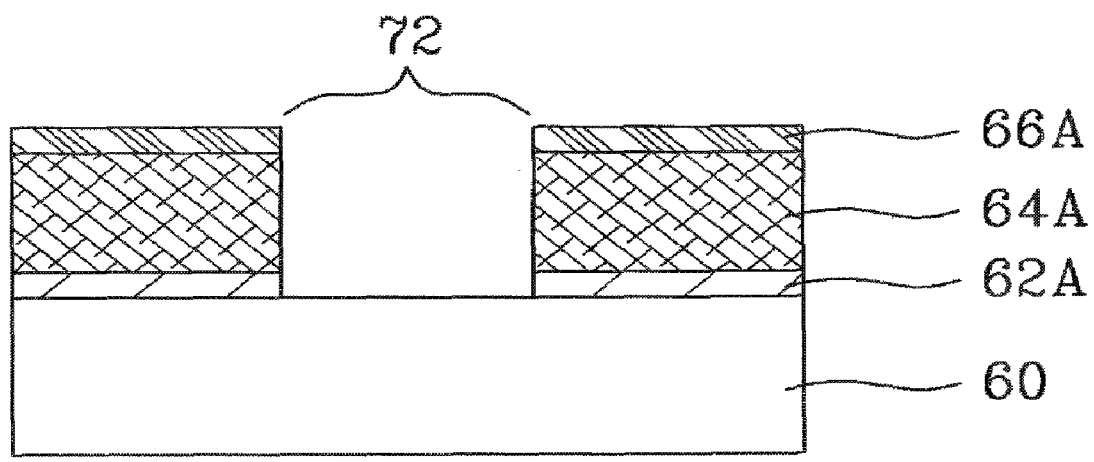

As illustrated in example FIG. 2F, after first dielectric layer 60 is partially exposed, photoresist pattern 68A and metal etching prevention layer 70 are removed. Here, $O_2$ plasma and wet-etching may be used in removing photoresist pattern 68A and metal etching prevention layer 70. Lower layer 62A illustrated in FIG. 2F enhances an adhesive force between middle metal layer 64A and dielectric layer 60, while preventing generation of blisters. Furthermore, lower metal layer 62A maximizes electromigration (EM) by promoting growth of Al of middle metal layer 64A. Upper metal layer 66A functions as an etching stop layer when a first or second interlayer dielectric is etched afterward to form contact plugs.

As apparent from the above description, in accordance with embodiments, a method for forming a metal line of a semiconductor device may include forming a metal etching prevention layer after a metal layer such as an Al layer is etched, and a lower layer is then etched after formation of the metal etching prevention layer. Accordingly, the metal layer can be prevented from being attacked by fluorine generated when the lower layer is etched, thereby maximizing the reliability of the metal line, especially electromigration. In other words, although most plasma has straightness due to a bias applied during etching of the lower layer, the sidewalls of the metal layer may be attacked by plasma not having straightness. Here, the metal layer can be protected from the attack by the metal etching prevention layer. Also, fluorine generated during etching of the lower layer can be easily and thoroughly removed.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for forming a metal line in a semiconductor device comprising:
    sequentially forming a dielectric layer, a lower layer, a metal layer and an upper layer sequentially over a semiconductor substrate; and then
    forming a photoresist pattern partially exposing the upper layer a predetermined lateral spatial interval; and then
    etching the upper layer and the metal layer using the photoresist pattern as a mask to partially expose the lower layer by the predetermined lateral spatial interval; and then
    forming a metal etching prevention layer over the exposed lower layer, the etched upper layer, the etched metal layer and the photoresist pattern; and then
    etching the lower layer using the photoresist pattern and the metal etching prevention layer as masks to partially expose the dielectric layer by the predetermined lateral spatial interval.

2. The method of claim 1, further comprising, after partially exposing the dielectric layer, removing the photoresist pattern and the metal etching prevention layer.

3. The method of claim 2, wherein the photoresist pattern and the metal etching prevention layer are removed by $O_2$ plasma and wet-etching.

4. The method of claim 1, wherein the lower layer and the upper layer comprise one of Ti, TiN and compounds thereof and the metal layer comprises Al.

5. The method of claim 4, wherein the upper layer and the metal layer are etched by a $C_xF_y$ based etching gas.

6. The method of claim 4, wherein the metal etching prevention layer is formed by injecting silane gas over the exposed lower layer, the etched upper layer, the etched metal layer and the whole surface of the photoresist pattern.

7. The method of claim 6, wherein the metal etching prevention layer is formed at a temperature in a range between approximately 100 to 200° C., and the injected silane quantity is in a range between approximately 100 to 2000 sccm.

8. The method of claim 4, wherein the lower layer is etched by a $C_xF_y$ based etching gas.

9. The method of claim 8, wherein a bias application voltage of the $C_xF_y$ based etching gas is in a range between approximately 10 to 1000 W.

10. The method of claim 1, wherein the lower layer, the metal layer and the upper layer are deposited by physical vapor deposition (PVD).

11. The method of claim 10, wherein the lower layer and the upper layer are formed at a temperature in a range between approximately 25° C. to 350° C. and the metal layer is formed in a temperature in a range between approximately 25° C. to 450° C.

12. The method of claim 1, wherein etching the upper layer and the metal layer comprises etching the photoresist pattern such that an upper part thereof is curved.

13. A method comprising:
sequentially forming a dielectric layer, a lower metal layer, a middle metal layer and an upper metal layer over a semiconductor substrate; and then
exposing a portion of the upper metal layer by forming photoresist patterns spaced apart a predetermined distance on the upper metal layer; and then
exposing a portion of the lower metal layer by simultaneously etching the upper metal layer, the middle metal layer using an etching gas and also partially etching the photoresist patterns; and then
simultaneously forming a silicon (Si) monolayer as a etching prevention layer over the exposed portion of the lower metal layer and sidewalls of the upper metal layer, the middle metal layer, and the entire surface of the photoresist patterns and also removing a component of the etching gas; and then
forming metal lines over the semiconductor substrate by etching the exposed portion of the lower metal layer to expose a portion of the dielectric layer.

14. The method of claim 13, wherein the lower metal layer and the upper metal layer are composed of one of titanium (Ti), titanium nitride (TiN) and compounds thereof.

15. The method of claim 14, wherein the middle metal layer is composed of aluminum (Al).

16. The method of claim 13, wherein exposing the portion of the lower metal layer is performed using reactive ion etching (RIE).

17. The method of claim 13, wherein the etching gas comprises a $C_xF_y$ based etching gas.

18. The method of claim 13, wherein forming the silicon (Si) monolayer comprises:
contacting the exposed portion of the lower metal layer and sidewalls of the upper metal layer, the middle metal layer, and the entire surface of the photoresist patterns with silane ($SiH_4$) gas at a temperature in a range between approximately 100 to 200° C. and using a dosage of silane ($SiH_4$) in a range between approximately 100 to 2000 sccm.

19. The method of claim 13, further comprising, after forming the metal lines, removing the photoresist pattern and the metal etching prevention layer.

20. The method of claim 13, wherein the lower layer is etched using a $C_xF_y$ based etching gas at a bias application voltage in a range between approximately 10 to 1000 W.

* * * * *